United States Patent
Hollis et al.

(10) Patent No.: US 11,568,913 B2
(45) Date of Patent: Jan. 31, 2023

(54) VOLTAGE ADJUSTMENT BASED ON PENDING REFRESH OPERATIONS

(71) Applicant: Micron Technology, Inc., Boise, ID (US)

(72) Inventors: Timothy M. Hollis, Meridian, ID (US); James S. Rehmeyer, Boise, ID (US); Baekkyu Choi, San Jose, CA (US); Yogesh Sharma, Boise, ID (US); Eric J. Stave, Meridian, ID (US); Brian W. Huber, Allen, TX (US); Miles S. Wiscombe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 17/164,738

(22) Filed: Feb. 1, 2021

(65) Prior Publication Data

US 2021/0241810 A1 Aug. 5, 2021

Related U.S. Application Data

(60) Provisional application No. 62/970,676, filed on Feb. 5, 2020.

(51) Int. Cl.
   *G11C 11/406* (2006.01)
(52) U.S. Cl.
   CPC .................... *G11C 11/406* (2013.01)
(58) Field of Classification Search
   CPC .................................................. G11C 11/406
   USPC ........................................................ 365/149
   See application file for complete search history.

(56) References Cited

U.S. PATENT DOCUMENTS

| 6,930,944 B2 * | 8/2005 | Hush ..................... G11C 11/406 |
| | | 365/194 |
| 9,640,242 B1 * | 5/2017 | Lo ........................ G11C 11/4074 |
| 2003/0131269 A1 | 7/2003 | Mizyuabu et al. |
| 2014/0181361 A1 | 6/2014 | Kegel |

(Continued)

OTHER PUBLICATIONS

ISA/KR, International Search Report and Written Opinion of the International Searching Authority, Int'l Appl. No. PCT/US2021/016176, dated May 24, 2021, Korean Intellectual Property Office, Seo-gu, Daejeon, Republic of Korea, 10 pgs.

*Primary Examiner* — Connie C Yoha
(74) *Attorney, Agent, or Firm* — Holland & Hart LLP

(57) ABSTRACT

Methods, systems, and devices for voltage adjustment based on, for example, pending refresh operations are described. A memory device may periodically perform refresh operations to refresh volatile memory cells and may at times postpone performing one or more refresh operations. A memory device may determine a quantity of pending (e.g., postponed) refresh operations, such as by determining a quantity of refresh intervals that have elapsed without receiving or executing a refresh command, among other methods. A memory device may pre-emptively adjust (or cause to be adjusted) a supply voltage associated with the memory device or memory device component based on the quantity of pending refresh operations to prepare for the current demand associated with the performing the one or more pending refresh operations. For example, the memory device may increase a supply voltage associated with one or more components to prepare for performing multiple pending refresh operations.

21 Claims, 7 Drawing Sheets

(56) References Cited

U.S. PATENT DOCUMENTS

2015/0309752 A1   10/2015   Ellis et al.
2015/0380072 A1   12/2015   Schaefer
2018/0335977 A1   11/2018   Tidwell et al.
2020/0251150 A1*  8/2020   Badrieh ................ G11C 11/221

* cited by examiner

VOLTAGE ADJUSTMENT BASED ON PENDING REFRESH OPERATIONS

CROSS REFERENCE

The present Application for Patent claims the benefit of U.S. Provisional Patent Application No. 62/970,676 by HOLLIS et al., entitled "VOLTAGE ADJUSTMENT BASED ON PENDING REFRESH OPERATIONS," filed Feb. 5, 2020, assigned to the assignee hereof, and expressly incorporated by reference herein.

BACKGROUND

The following relates generally to one or more memory systems and more specifically to voltage adjustment based on pending refresh operations.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of a power source. Volatile memory devices, e.g., DRAM, may lose their stored state when disconnected from a power source.

DETAILED DESCRIPTION

Figure 1:
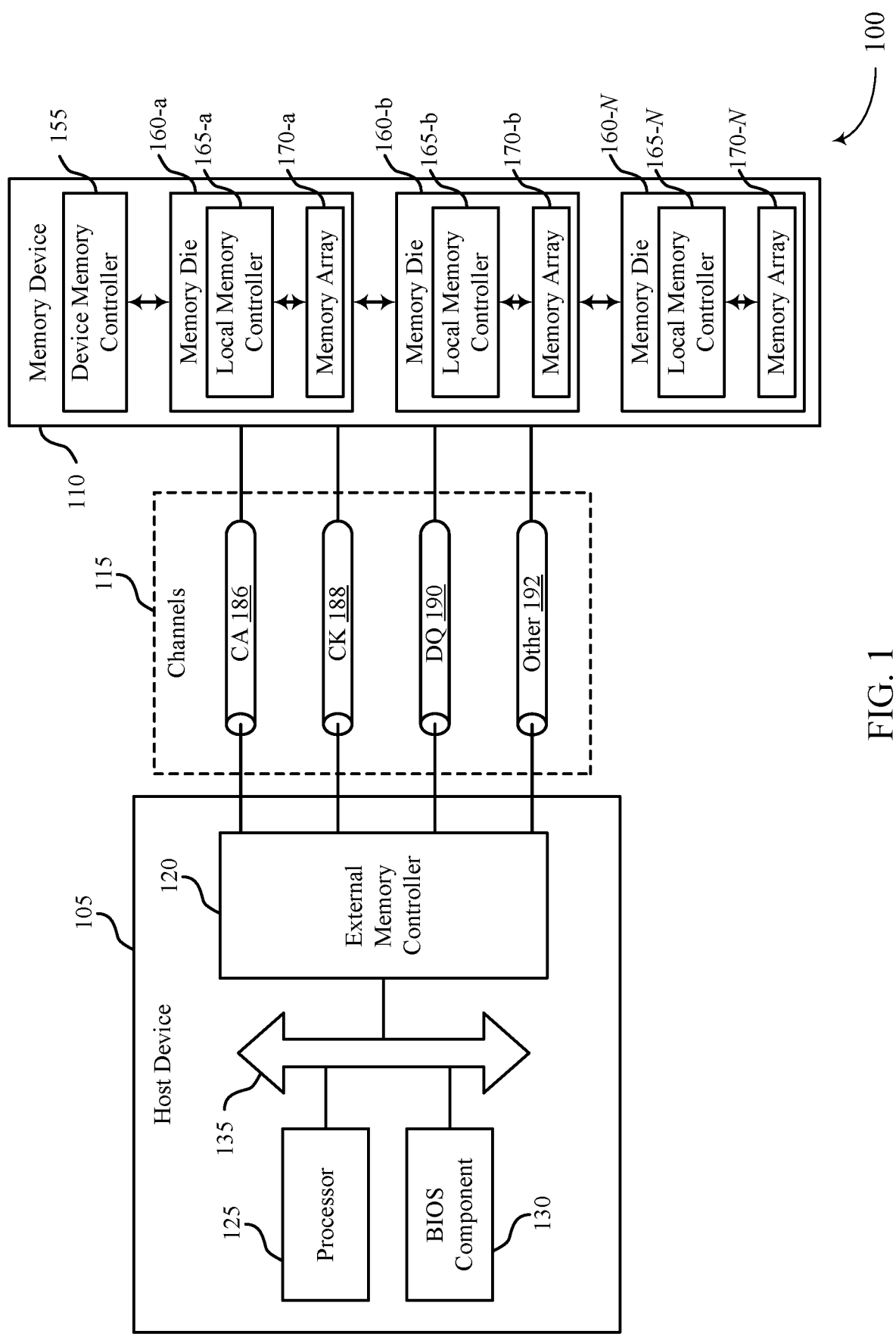
FIG. 1 illustrates an example of a system that supports voltage adjustment based on pending refresh operations in accordance with examples as disclosed herein.

Some volatile memory cells may need to be refreshed (e.g., periodically refreshed) to maintain their state during operation. Such memory cells may be refreshed by reading and restoring (e.g., restoring back to a first stored level) the state of the memory cells to mitigate the potential loss of state information due to, for example, charge leakage. The first stored level may be an example of a level different than a voltage when then the memory array powers up or a first value written to a memory cell. In such cases, the first stored level may be an example of an originally stored level, an intended level, or an expected level. For example, DRAM cells may include a capacitor for storing the state of the memory cell, and such memory cells may need to be refreshed to compensate for charge leakage from the capacitor over time. A memory device may therefore reserve certain time periods, sometimes referred to as refresh intervals, for performing one or more refresh operations. One or more refresh operations may be performed during a refresh interval in response to receiving a refresh command from, for example, a controller or a host device.

In some cases, some or all of a memory array may not be available for one or more other memory access operations (such as one or more read operations or one or more write operations), for example, while the memory array is performing a refresh operation. This lack of availability may increase the latency associated with performing one or more operations, such as memory access operations, which may be undesirable for some latency-sensitive operations. To address this issue, some memory devices allow a host device to postpone one or more refresh operations by postponing sending one or more refresh commands until such time as it is convenient. In this case, one or more refresh intervals may elapse without the memory device receiving a refresh command and performing a refresh operation. The postponed refresh command(s), however, may result in an accrual of pending refresh operations until such time as the memory device receives the refresh command(s) and may perform the corresponding refresh operations. In some cases, the memory device may receive multiple consecutive refresh commands that cause the memory device to "make up" the postponed refresh operations and ensure that the maximum time duration between refresh operations is not exceeded. In this case, the memory device may perform multiple refresh operations within a relatively short time period, such as by performing multiple refresh operations during a single refresh interval.

In some examples, a memory device may include or may be coupled with a power management component, such as a power management integrated circuit (PMIC), that may be used to manage the power supplied to the memory device by controlling the voltage of one or more power supply rails. The power supply rails may be part of a power delivery network that provides the memory device with various supply voltages to enable its operation, and may each be associated with a nominal supply voltage that may be specified for the memory device. Each refresh operation may draw a relatively large current from one or more power supply rails. Thus, performing multiple make-up refresh operations within a relatively short time period, as sometimes may occur, may strain the power delivery network of the memory device, and may cause the voltage of the power supply rail to droop (e.g., fall, decrease) below the nominal supply voltage. In some cases, such voltage droop may be sufficient to result in decreased performance of the memory device or memory errors.

In some examples, a memory device may determine (e.g., predict) such an increased demand for power (e.g., current or voltage) from the power delivery network by determining a quantity of pending (e.g., postponed) refresh operations, among other parameters or conditions. The memory device may indicate, to the power management component, a target voltage for a power supply rail based on the quantity of pending refresh operations. In some cases, a registered clock driver (RCD) may indicate, to the power management component, a target voltage for a power supply rail based on the quantity of pending refresh operations. The target voltage may be different than the nominal supply voltage. For example, if the memory device determines that there are multiple pending refresh operations, the memory device may request a higher target voltage for a power supply rail than the nominal supply voltage to pre-emptively prepare for performing the multiple refresh operations under a "make-up" scenario.

The memory device may determine the quantity of pending refresh operations by, for example, identifying (e.g., counting or otherwise determining) a quantity of refresh intervals that have elapsed without receiving a refresh command, identifying (e.g., counting or otherwise determining) a quantity of received refresh commands, and determining (e.g., calculating) a difference between the two quantities.

The power management component may, in turn, adjust (e.g., temporarily) the voltage of the power supply rail based on the target voltage indicated by the memory device, thereby potentially compensating for the increased demand on the power delivery network during make-up refresh operations.

Features of the disclosure are further described below in the context of memory systems and dies with reference to FIG. 1. Features of the disclosure are then described in the context of systems and voltage signals with reference to FIGS. 2-4. These and other features of the disclosure are further illustrated by and described with reference to an apparatus diagram and flowcharts in FIGS. 5-7 that relate to voltage adjustment based on pending refresh operations.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

Some memory arrays 170 may be or may include arrays of volatile memory cells, such as DRAM memory cells. Some volatile memory cells may lose their state over time and may be periodically refreshed (e.g., read and restored) to maintain their state. In some cases, volatile memory cells may be characterized in terms of the frequency with which they may need to be refreshed to maintain their state, which may be referred to as a refresh interval. A memory die 170 may periodically perform refresh operations on one or more rows of memory cells of a memory array 170 to maintain the state of the memory cells.

Memory die 160 may include logic circuitry that may be configured to periodically perform such refresh operations on memory cells by reading and restoring (e.g., firing a sense component to amplify the voltage on the memory cells back to the originally written voltage levels) the states of the memory cells. In some cases, such logic circuitry may be part of local memory controller 165 or may be separate circuitry. In some cases, memory die 160 may perform a refresh operation on memory cells of one or more rows of a memory array 170 in response to receiving a refresh command from an external host device or based on internal timing that specifies a frequency with which memory cells may be refreshed.

In some cases, a memory die 160 may refresh one or more rows of a memory array 170 in response to receiving a refresh command from an external device (such as a host device), which may be referred to as performing an auto refresh operation. The external device may transmit the refresh command to the memory die based on timing information maintained at the external device, for example.

In some cases, a memory die 160 may refresh one or more rows of a memory array 170 based on receiving a refresh command from a controller of the memory die, which may be based on internal (e.g., on-die) timing that indicates the amount of time that has elapsed since a row of memory cells was last read or refreshed. Such refreshes may be referred to as performing a self-refresh operation.

In some cases, performing a refresh operation on a row of memory cells of a memory array may include performing a read and restore procedure that includes performing an activate (Act) operation on the row to activate the row and cause the memory cells to be read and restored (e.g., by sense amplifiers), and then performing a pre-charge (Pre) operation on the digit lines to prepare for the next access operation and return the digit lines to a pre-charged state for the next row activation. Such a sequence may be referred to as an Act/Pre sequence.

In some cases, the activate operation may cause a word line associated with the row of memory cells to be activated (e.g., asserted), thereby selecting memory cells coupled with the word line. The selected memory cells may charge share with corresponding digit lines, thereby changing the voltage on the digit lines based on the logic state stored by the memory cell. Sense amplifiers that are coupled with the digit lines may drive the digit lines to one of two values based on the voltage on the digit line, causing the memory cells to be restored to the full charge associated with the logic state (e.g., refreshed). The pre-charge operation may cause the digit line to be biased to a pre-charge voltage to prepare the digit line for a subsequent access operation.

During the Act/Pre sequence, some or all of the memory array 170 may be unavailable for other memory accesses, which may introduce latencies into memory access operations. In some cases, one or more refresh commands may be postponed to enable continued memory accesses of memory device 110. The postponed refresh operations may subsequently be "made up" during one or more subsequent refresh intervals. Additional details regarding the timing of refresh operations are described in more detail with reference to FIG. 3.

In some examples, a memory die 160 may be coupled with a power management component that is operable to provide one or more supply voltages to the memory die 160. For example, the power management component may supply a VDD voltage, a VSS voltage, a VDDQ voltage, etc. using power supply rails (e.g., conductive lines). The power management component may be operable to maintain a substantially constant supply voltage on the rail to provide power to the memory device 110 or memory die 160 during operation. The power management component may include or may be coupled with one or more voltage supply components that are operable to generate the appropriate supply voltage. In some cases, the power management component may be referred to as a PMIC.

In some cases, the power management component may be operable to receive, from the memory device 110 or memory die 160, an indication of a target voltage for a power supply rail, and may adjust the supply voltage on the rail based on the indicated target voltage. The supply voltage may be adjusted for a limited duration (e.g., temporarily). The memory device 110 or memory die 160 may determine the target voltage based on a quantity of pending (e.g., postponed) refresh operations, for example. A memory die 160 (or memory device 110) may include a pin for providing a signal indicating a target voltage to the power management component, thereby enabling the power management component to adjust the supply voltage appropriately.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controllers 120, the one or more memory dies 160, or the processor 125. In some examples, the device memory controller 155 may control operation of the memory device 110 described herein in conjunction with the local memory controller 165 of the memory die 160. In some examples, the device memory controller 155 may include a RCD. The RCD may include a register used for buffering memory control signals or commands.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In some examples, a device memory controller 155 or local memory controller 165 of a memory die 160 may be operable to determine a quantity of pending refresh operations. A memory device 110 may be operable to adjust a supply voltage associated with the memory device based on the quantity of pending refresh operations.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
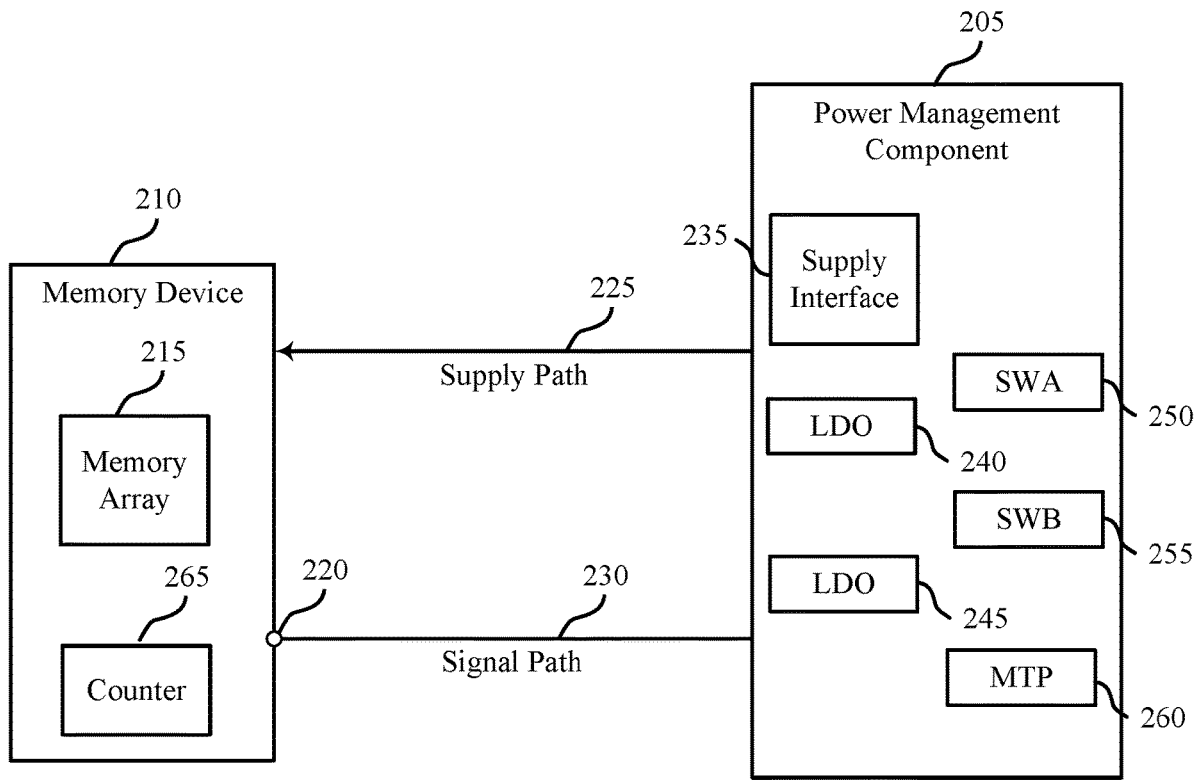
FIG. 2 shows an example of a memory system that supports voltage adjustment based on pending refresh operations in accordance with examples as disclosed herein.

FIG. 2 illustrates an example of a memory system 200 that supports voltage adjustment based on pending refresh operations. The memory system 200 may include a power management component 205, a memory device 210 that includes a memory array 215, and a signal path 230 and supply path 225 between the power management component 205 and the memory device 210. In the example of memory system 200, the signal path 230 and/or supply path 225 may be an example of conductive lines that couple the power management component 205 with the memory device 210. The memory device 210 may be an example of a memory device 110 as described with reference to FIG. 1, and may also include, for example, a device memory controller, an RCD, and/or other components of memory device 110. Memory array 215 may be an example of memory array 170 as described with reference to FIG. 1.

The power management component 205 may include a supply interface 235, low-dropout regulators (LDO) 240, 245, power supplies (SWA, SWB) 250, 255 (e.g., switching regulators), and multi-time programmable memory (MTP) 260. The supply interface 235 may be operable to receive power to activate the power management component 205 and to be distributed to other components of a memory system (e.g., memory device 210) through the power management component 205.

The low-dropout regulators 240, 245 may be used for outputting power (e.g., DC power) to memory devices of the memory system, including memory device 210. In some cases, the low-dropout regulators 240, 245 may be used to regulate an output voltage, such as a supply voltage. The power supplies 250, 255 may be used for outputting power to memory devices of the memory system, including memory device 210. The power management component 205 may include any quantity of low-dropout regulators (e.g., one, two, three, four, five, six, seven, eight), or may include any quantity of power supplies (e.g., one, two, three, four, five, six, seven, eight), or any quantity of both.

The multi-time programmable memory 260 may be any type of memory used by the power management component 205 for performing the functions described herein. In some cases, the multi-time programmable memory 260 may be an example of an electrically erasable programmable read-only memory (EEPROM) or other type of memory technology. The multi-time programmable memory 260 may be for protecting circuits, improving a reliability of a power-on sequence or a power-off sequence, setting of output voltage(s), setting of output pull-down resistance(s), or other functions, or any combination thereof.

The supply path 225 may be a power supply rail (or may be coupled with a power supply rail) to enable the power management component 205 to provide a supply voltage to memory device 210, for example. A supply voltage may be used by memory device 210 during operation of memory device 210, and may include, for example, a VDD voltage, a VSS voltage, or another supply voltage.

In some cases, the power management component 205 may be coupled with a sense line (e.g., an analog sense line) that provides feedback, to the power management component 205, regarding the voltage of a power supply rail (e.g., the voltage of supply path 225). Such an analog sense line may be used by the power management component 205 to try to maintain a nominal voltage on the power supply rail, such as to maintain a VDD voltage, VSS voltage, or another voltage. The power management component 205 may compare the voltage of the sense line with a reference voltage, and may adjust the supply voltage based on the comparison.

Memory device 210 may be operable to determine a quantity of pending refresh operations and to provide, to power management component 205, a target voltage for a power supply rail based on the quantity of pending refresh operations. The target voltage may be different than or the same as the nominal supply voltage, depending on the quantity of pending refresh operations.

To determine the quantity of pending refresh operations, memory device 210 may include one or more counters 265 to count a quantity of pending refresh operations, a quantity of elapsed refresh intervals, a quantity of received refresh commands, or a combination of these. In some examples, memory device 210 may include an oscillator tuned to a refresh interval time (which may be referred to as tREFI), and each time a refresh interval elapses without receiving a refresh command, counter 265 may be incremented. In some cases, identifying a quantity of refresh intervals comprises incrementing a refresh interval counter for each elapsed refresh interval, and identifying a quantity of refresh commands comprises decrementing the refresh interval counter for each received refresh command. In some examples, a counter 265 may be located on a device memory controller, an RCD, or a DRAM of memory device 210. In some examples, the power management component 205 may include the RCD. In this case, a counter 265 may be coupled directly with the power management component 205.

In some cases, memory device 210 may be operable to provide (e.g., transmit) a signal indicating a target voltage to the power management component 205 to cause the power management component 205 to adjust the voltage of the power supply rail to a different voltage than the nominal supply voltage. Such a signal may be an analog or digital signal. The voltage may be adjusted for a duration that extends from when the power management component 205 receives the signal indicating the target voltage when the memory device 210 performs one or more make-up refresh operations.

For example, the memory device 210 may transmit (e.g., generate, drive, provide) an analog signal that adjusts the voltage of the analog sense line, based on the determined quantity of pending refresh operations, in order to indirectly provide a target voltage to the power management component 205. For example, the memory device 210 may reduce the voltage on the analog sense line to cause the power management component 205 to increase the supply voltage on the power supply rail, or vice versa. That is, a memory device 210 may be configured to manipulate the feedback received by the power management component 205 on the sense line to control the supply voltage provided by the power management component 205.

As previously discussed, the power management component 205 may compare the voltage of the sense line with a reference voltage, and may adjust the supply voltage based on the comparison. In some examples, the memory device 210 may transmit a signal that manipulates the reference voltage rather than the sense line voltage to cause the power management component 205 to adjust the supply voltage on the power supply rail. The signal path 230 may be coupled with a reference line that provides the reference voltage, and the memory device 210 may adjust the reference voltage by transmitting an analog or digital signal on the signal path 230.

If a counter 265 is directly coupled with the power management component (e.g., if the RCD resides in the power management component 205), the signal may include the output of the counter 265, which the power management component 205 may then use to determine how to adjust the supply voltage.

The feedback signal transmitted by the memory device 210 to the power management component 205 may be generated (e.g., may originate) from various components of the memory device 210, such as from a memory array, a device memory controller, an RCD, or another component. For example, the RCD may transmit the feedback signal to the power management component 205.

In some cases, the memory device 210 may include a pin 220 for providing a signal indicating a target voltage to a power management component 205. The signal path 230 may couple the pin 220 of the memory device 210 with the power management component 205, such as with the sense line, the reference line, or another input to the power management component 205. In some examples, memory device 210 may provide a digital or analog signal to the power management component 205 indicating the target voltage.

A pin may be, for example, a conductive terminal of an integrated circuit package that allows the integrated circuit to be connected with other components or circuitry. A pin 220 may also be referred to as a pad, a socket, a connector, a contact, or a ball (for a ball grid array), for example. In some cases, a pin 220 may be a conductive point that is within an integrated circuit package or external to the integrated circuit package. In some cases, a pin 220 may be associated with a predefined functionality (e.g., a predefined type or format of signal) that may be specified, for example, as part of a standardized interface that allows an integrated circuit to be connected to other circuitry or components.

The signal path 230 may include any set of one or more lines that establish a communicative link between the memory device 210 and the power management component 205. The signal path 230 may directly couple the memory device 210 and the power management component 205, meaning that the signal path 230 may establish a connection between the two components that allows a signal to be routed between the components using conductive lines.

A memory system 200 or memory device 210 may refer to a single in-line memory module (SIMM), a dual-in-line memory module (DIMM), or another type of module or assembly. In some cases, a SIMM or DIMM may include a power management component (e.g., as depicted in memory system 200). In some cases, the power management component 205 may be external to the SIMM or DIMM.

In some cases, a memory system 200 may include a single DRAM integrated circuit (e.g., a single memory device 210). A memory system 200 that includes a single DRAM integrated circuit may include a first quantity of pins (e.g., 72 pins or another quantity of pins) that may be used, for example, to couple the memory system 200 with a power management component, a host processor, or other electronic components. In this case, each pin of a memory system 200 may support 32-bit data transfers.

In some cases, a memory system 200 may include a series of DRAM integrated circuits, such as a series of memory devices 210. A memory system 200 that includes a series of DRAM integrated circuits may include a second quantity of pins (e.g., 100, 144, 168, 172, 184, 204, 214, 240, or another quantity of pins) that may be used, for example, to couple the memory system 200 with a power management component, a host processor, or other electronic components. In this case, each pin of a memory system 200 may support 64-bit data transfers.

In some cases, the above-described quantity of pins for a memory system 200 may include a pin for providing feedback to a power management component. In some cases, an additional pin may be added to the memory system 200 to provide this functionality, and thus the quantity of pins may be increased by one relative to the above-described quantity of pins for a memory system 200.

Techniques are provided herein for a memory device 210 to provide a signal to a power management component 205 to enable the power management component 205 to pre-emptively adjust a supply voltage in preparation for performing one or more make-up refresh operations, such as refresh operations that were previously postponed. The supply voltage may be adjusted for a duration that extends until the memory device 210 performs one or more make-up refresh operations. For example, a memory device 210 may determine a quantity of postponed refresh operations. The memory device 210 may determine a target voltage for a supply voltage based on the quantity of pending refresh operations. The memory device 210 may send a signal (e.g., using signal path 230) to power management component 205 that indicates the target voltage. In some examples, the RCD may send a signal (e.g., using signal path 230) to power management component 205 that indicates the target voltage. The signal may be received by the power management component 205 (and/or by another device, such as a host device) and may be used by the power management component 205 to regulate (e.g., maintain or adjust) the supply voltage or to regulate another operational aspect of memory device 210.

Figure 3:
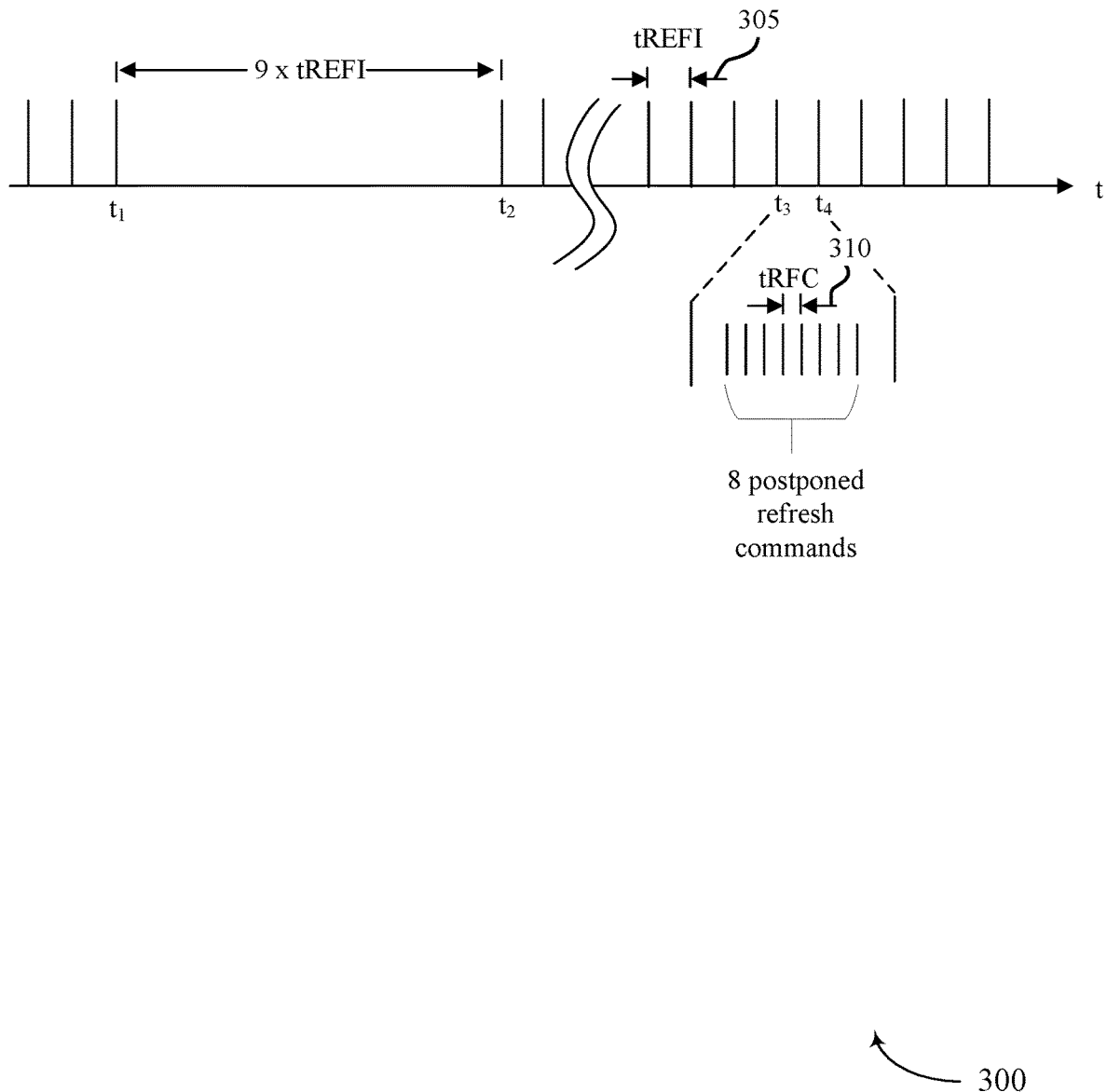
FIG. 3 shows an example of refresh timing that supports voltage adjustment based on pending refresh operations in accordance with examples as disclosed herein.

FIG. 3 illustrates an example of a refresh timeline 300 that supports voltage adjustment based on pending refresh operations. Refresh timeline 300 depicts two time durations: a refresh interval 305 (tREFI) and a refresh cycle interval 310 (tRFC).

The refresh interval 305 may be a duration of time that is reserved (e.g., allocated) by a memory device for performing one or more refresh operations in response to receiving one or more refresh commands. The duration of the refresh interval may vary for different memory devices. For example, refresh interval 305 may be 7.8 µs for certain memory devices, and may be a different duration of time for other memory devices. In some cases, the refresh interval 305 may be specified as a quantity of processor cycles, such as processor cycles of a host device or controller.

The refresh cycle interval 310 may be a duration of time that is used by or allocated to a memory device to perform a refresh operation. The refresh cycle interval 310 may be the same or shorter than the refresh interval 305, for example. That is, the duration of a single refresh interval 305 may include a duration of one or more refresh cycles 310. A refresh cycle 310 may be initiated in response to receiving a refresh command, for example.

Some memory devices may specify that a refresh operation may be (or should be) issued to the memory device at each refresh interval 305. Some memory devices may allow a memory controller to postpone issuing one or more refresh commands to a later refresh interval 305. For example, a memory device may specify that eight refresh commands may be (or should be) issued within a time duration of 8×tREFI (or based on some other timing criteria) to meet a specified refresh frequency, which may enable a memory controller some flexibility in scheduling refresh operations to provide better overall performance of the memory device.

In the example of refresh timeline 300, nine refresh intervals 305 may elapse between time t1 and time t2 without the memory device receiving a refresh command. After time t2, there may be, for example, eight pending refresh operations.

At or before time t3, the memory device may receive eight refresh commands (e.g., corresponding to the eight postponed refresh commands) and may perform eight corresponding refresh operations during a refresh interval 305 between time t3 and time t4. That is, memory device may perform eight "make-up" refresh operations within the refresh interval 305 between time t3 and time t4, each of which may be performed during a corresponding refresh cycle interval 310. Such closely spaced refresh operations may place a high demand on the power delivery network by drawing a relatively large current, potentially causing a supply voltage to droop.

To counteract this effect, a memory device may identify a quantity of refresh intervals 305 that elapse without receiving a refresh command (in this example, nine refresh intervals) and determine a quantity of pending refresh operations.

The memory device may transmit a signal to the power management component indicating a target voltage for a supply rail of the power delivery network, where the target voltage is based on the quantity of pending refresh operations. That is, a memory device may keep track of pending refresh operations and pre-emptively request a higher supply voltage to prepare for the make-up execution of the pending refresh operations. The power management component may receive the signal indicating the target voltage, and may adjust a supply voltage based on the received target voltage. For example, the power management component may adjust the supply voltage to match (e.g., meet or approach) the target voltage.

Figure 4A:
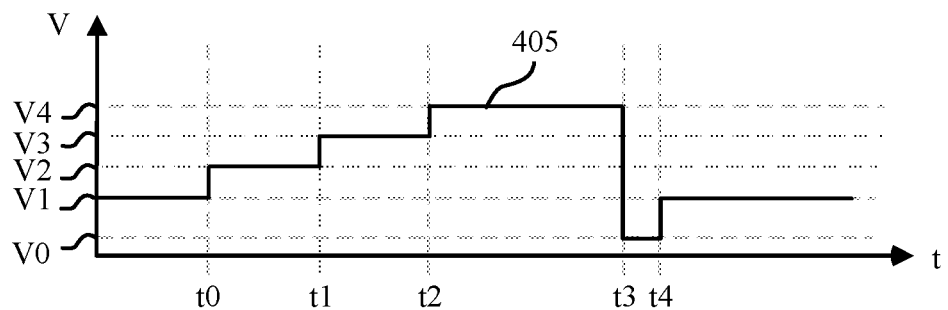
FIGS. 4A and 4B show examples of voltages that support voltage adjustment based on pending refresh operations in accordance with examples as disclosed herein.
Figure 4B:
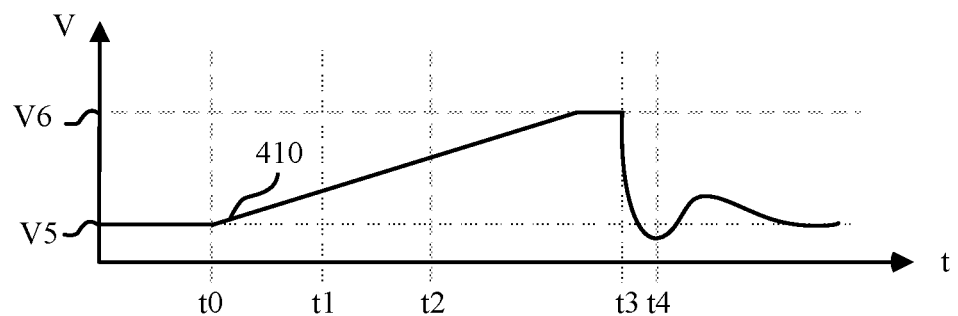

Examples of target voltages that may be transmitted in a signal from a memory device to a power management component and resulting supply voltages that may be provided by a power management component in response are depicted in FIGS. 4A and 4B, respectively.

FIG. 4A illustrates an example of a target voltage 405 that may be indicated in a signal that supports voltage adjustment based on pending refresh operations. Target voltage 405 may be a target for a supply voltage, such as a voltage supplied by a power management component on a power supply rail. A memory device (such as memory device 110, 210) may transmit a signal indicating the target voltage 405 to a power management component (such as power management component 205) to enable the power management component to adjust a supply voltage based on the target voltage.

In some examples, a memory device may transmit the signal indicating the target voltage continuously or nearly continuously, and may dynamically update the value of the target voltage based on an ongoing determination of the quantity of pending refresh operations. In some examples, a memory device may transmit the signal indicating the target voltage intermittently, such as transmitting the signal periodically or when the memory device changes the target voltage, or based on some combination of these or other factors. The memory device may refrain from transmitting the signal at other times.

In the example of FIG. 4A, the memory device may increase the target voltage each time the memory device determines that the quantity of pending refresh operations has increased, such as each time the memory device determines that a refresh interval has elapsed without receiving a refresh command. The memory device may increase the target voltage incrementally, such as by the same amount each time, or may increase the target voltage in some other manner. In some examples, the memory device may increase the target voltage until it reaches a maximum target voltage, and may not further increase the target voltage in response to determining that the quantity of pending refresh operations has been further increased.

Although not shown in FIG. 4A, a memory device may also decrease the target voltage each time the memory device determines that the quantity of pending refresh operations has decreased, such as each time the memory device receives a refresh command, until the quantity of pending refresh operations reaches zero.

In FIG. 4A, voltage V1 may correspond to a nominal supply voltage associated with a memory device, such as a VDD voltage, VDDQ, VSS, or other fixed supply voltage. Before time t0, the memory device may determine that there are no pending refresh intervals, and may therefore set the target voltage to voltage V1.

At time t0, the memory device may determine that a first refresh interval (e.g., a refresh interval 305) has elapsed without the memory device receiving a refresh command. That is, memory device may determine that there is one (1) pending refresh operation. Memory device may, in response to determining that there is one pending refresh operation, increase the target voltage 405 from V1 to V2.

At time t1, the memory device may determine that a second refresh interval has elapsed without the memory device receiving a refresh command, and may therefore determine that there are now two (2) pending refresh operations. Memory device may, in response to determining that there are two pending refresh operation, increase the target voltage 405 from V2 to V3.

At time t2, the memory device may determine that a third refresh interval has elapsed without the memory device receiving a refresh command, and may therefore determine that there are now three (3) pending refresh operations. Memory device may, in response to determining that there are three pending refresh operation, increase the target voltage 405 from V3 to V4.

At time t3, the memory device may receive one or more refresh commands, which may correspond to the pending refresh operations. Memory device may increase the identified quantity of received refresh commands based on receiving the one or more refresh commands, and may adjust the quantity of pending refresh operations based on the increased quantity of received refresh commands. Memory device may, in response to receiving the refresh command(s), begin performing at least some of the pending refresh operations and may decrease the target voltage from V4 to V0. In some cases, the memory device may perform at least some of the pending refresh operations based on adjusting the supply voltage, such as after adjusting the supply voltage.

In some cases, V0 may be a voltage that is below the nominal supply voltage, which may reduce or eliminate the subsequent overshoot of the supply voltage provided by the power management component when the power management component attempts to adjust the supply voltage back to the nominal supply voltage V1. In other cases, V0 may be equivalent to voltage V1.

At time t4, the memory device may determine that there are no pending refresh operations, and may increase the target voltage from V0 to V1, assuming V0 and V1 are different voltages.

FIG. 4B illustrates an example of a supply voltage 410 that supports voltage adjustment based on pending refresh operations. Supply voltage 410 may be a voltage supplied by a power management component in response to receiving a signal indicating the target voltages shown in FIG. 4A. That is, FIG. 4A may depict target voltages generated by a memory device and transmitted to a power management component, and FIG. 4B may depict the corresponding response of the power management component.

Before time t0, the power management component may provide a supply voltage of V5, which may be a nominal supply voltage for the memory device. Voltage V5 may be close to or equal to voltage V1, for example.

At time t0 (or shortly thereafter), the power management component may receive, from the memory device, a signal indicating a target voltage of V2, and may begin to increase the supply voltage towards V2 in response to receiving the signal.

At time t1 (or shortly thereafter), the power management component may receive, from the memory device, a signal indicating a target voltage of V3, and may begin to increase the supply voltage towards V3 in response to receiving the signal.

At time t2 (or shortly thereafter), the power management component may receive, from the memory device, a signal indicating a target voltage of V4, and may begin to increase the supply voltage towards V4 in response to receiving the signal. The supply voltage may reach voltage V6, which may be close to or equal to voltage V4.

At time t3 (or shortly thereafter), the power management component may receive, from the memory device, a signal indicating a target voltage of V0, and may begin to decrease the supply voltage towards V0 in response to receiving the signal. Thus, power management component may re-adjust the supply voltage based on the target voltage of V0, which may in turn be based on the adjusted quantity of received refresh commands.

At time t4 (or shortly thereafter), the power management component may receive, from the memory device, a signal indicating a target voltage of V1, and may begin to increase the supply voltage towards V1 in response to receiving the signal. The supply voltage may reach voltage V5, which may be close to or equal to voltage V1. In some cases, the supply voltage may overshoot voltage V5 before settling back down to voltage V5; the amount of overshoot may be reduced or eliminated if the memory device selects a target voltage V0 at time t3 that is below the nominal supply voltage.

In some cases, instead of incrementally adjusting a target voltage (and correspondingly adjusting the supply voltage) each time a refresh interval elapses without receiving a refresh command as depicted in FIGS. 4A and 4B, a memory device may determine when a quantity of pending refresh intervals satisfies (e.g., meets or exceeds) a threshold, such as when there are three or more pending refresh intervals (or another pre-determined quantity of pending refresh intervals). The memory device may adjust the supply voltage when the quantity of refresh operations satisfies the threshold, and may refrain from adjusting the supply voltage when the quantity of pending refresh operations does not satisfy the threshold. A memory device may adjust a supply voltage based on two or more such thresholds.

In some examples, a memory device may determine a quantity of pending refresh operations based on a window duration. That is, a memory device may determine a quantity of pending refresh operations based on a rolling time window rather than based on a cumulative amount of time.

Figure 5:
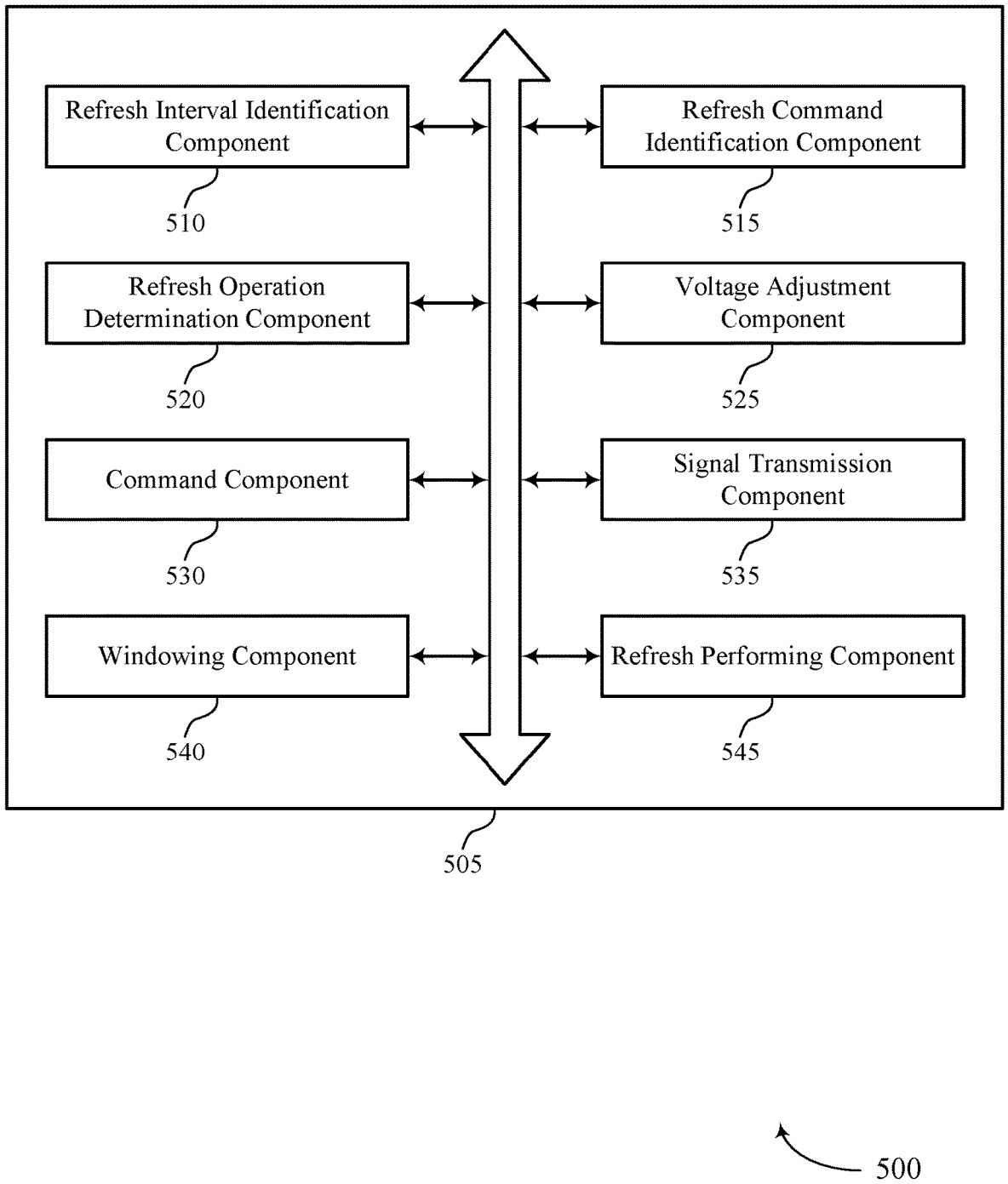
FIG. 5 shows a block diagram of a device that supports voltage adjustment based on pending refresh operations in accordance with examples as disclosed herein.

FIG. 5 shows a block diagram 500 of a memory device 505 that supports voltage adjustment based on pending refresh operations in accordance with examples as disclosed herein. The memory device 505 may be an example of aspects of a memory device as described with reference to FIGS. 1 and 2. The memory device 505 may include a refresh interval identification component 510, a refresh command identification component 515, a refresh operation determination component 520, a voltage adjustment component 525, a command component 530, a signal transmission component 535, a windowing component 540, and a refresh performing component 545. Each of these modules may communicate, directly or indirectly, with one another (e.g., via one or more buses).

The refresh interval identification component 510 may identify a quantity of refresh intervals associated with refreshing memory cells of a memory device.

The refresh command identification component 515 may identify a quantity of received refresh commands. In some examples, the refresh command identification component 515 may increase the identified quantity of received refresh commands based on receiving a first refresh command.

The refresh operation determination component 520 may determine a quantity of refresh operations by determining a difference between the quantity of refresh intervals and the quantity of received refresh commands. In some cases, the refresh operations are pending refresh operations. In some examples, the refresh operation determination component 520 may adjust the quantity of refresh operations based on increasing the identified quantity of received refresh commands.

In some examples, the refresh operation determination component 520 may determine that the quantity of refresh operations satisfies a threshold, where adjusting the supply voltage includes adjusting the supply voltage based on determining that the quantity of refresh operations satisfies the threshold.

In some examples, the refresh operation determination component 520 may determine, after adjusting the supply voltage, a second quantity of refresh operations by determining a second difference between the second quantity of refresh intervals and a second quantity of received refresh commands. In some examples, the refresh operation determination component 520 may determine that the second quantity of refresh operations satisfies a second threshold.

The voltage adjustment component 525 may adjust a supply voltage associated with the memory device based on the quantity of refresh operations. In some examples, the voltage adjustment component 525 may adjust, before performing at least some of the pending refresh operations, a supply voltage associated with the memory device based on the quantity of pending refresh operations. In some examples, adjusting the supply voltage includes increasing the supply voltage from a first voltage to a second voltage based on the quantity of refresh operations.

In some examples, the voltage adjustment component 525 may readjust the supply voltage based on an adjusted quantity of received refresh commands.

In some examples, the voltage adjustment component 525 may increase the target voltage from a first target voltage to a second target voltage based on identifying a first refresh interval.

In some examples, the voltage adjustment component 525 may increase the target voltage from the second target voltage to a third target voltage least in part on identifying a second refresh interval.

In some examples, the voltage adjustment component 525 may decrease the target voltage from the second target voltage to a third target voltage based on receiving a refresh command.

In some examples, the voltage adjustment component 525 may readjust the supply voltage based on determining that the second quantity of refresh operations satisfies the second threshold.

In some examples, adjusting the supply voltage includes increasing the supply voltage from a first voltage to a second voltage based on the quantity of pending refresh operations. In some cases, a value of the second voltage is based on the quantity of refresh operations.

The refresh performing component 545 may perform the at least some of the pending refresh operations based on adjusting the supply voltage associated with the memory device.

The command component 530 may receive a first refresh command after adjusting the supply voltage. In some examples, the command component 530 may receive a refresh command after increasing the target voltage from the first target voltage to the second target voltage.

The signal transmission component 535 may transmit, to a power management component, a signal indicating a target voltage based on the quantity of refresh operations, where adjusting the supply voltage includes adjusting, by the power management component, the supply voltage based on the target voltage.

The windowing component 540 may identify a window duration, where identifying the refresh intervals and the refresh commands includes identifying the refresh intervals and the refresh commands during the window duration.

Figure 6:
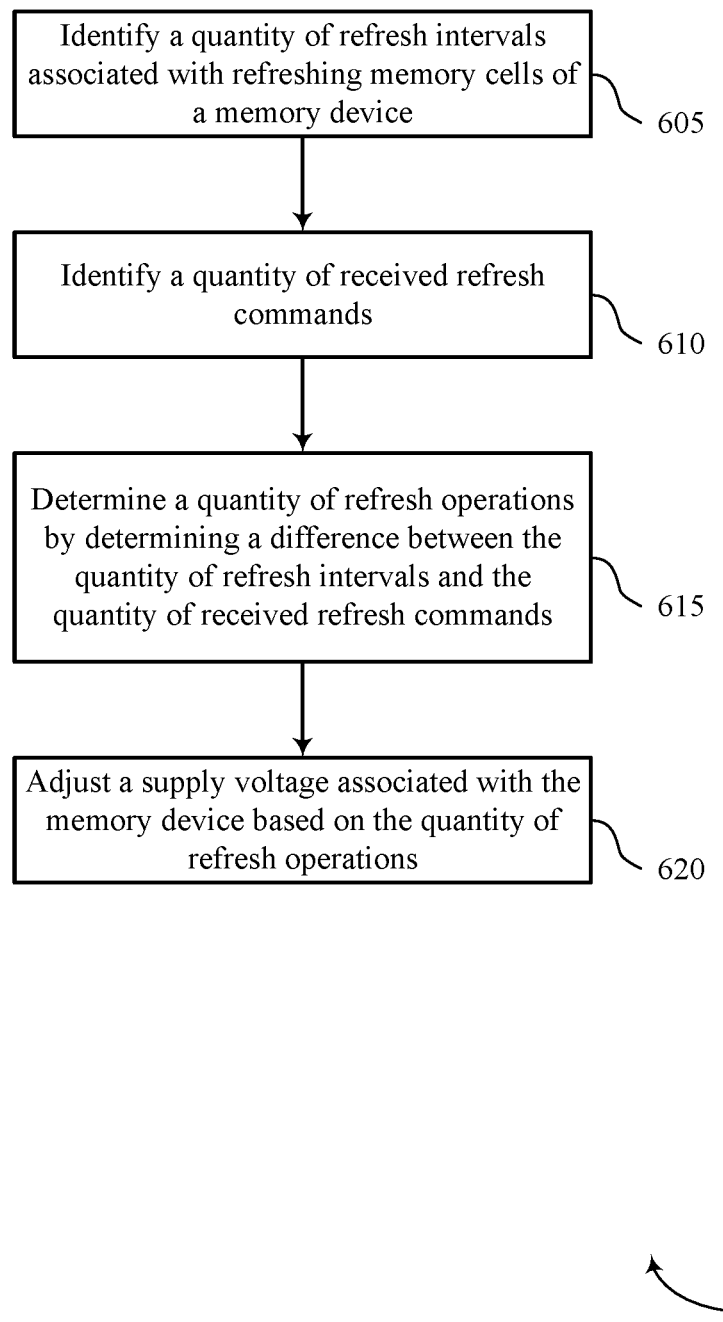
FIGS. 6 and 7 show flowcharts illustrating a method or methods that support voltage adjustment based on pending refresh operations in accordance with examples as disclosed herein.

FIG. 6 shows a flowchart illustrating a method or methods 600 that supports voltage adjustment based on pending refresh operations in accordance with examples as disclosed herein. The operations of method 600 may be implemented by a memory array or its components as described herein. For example, the operations of method 600 may be performed by a memory array as described with reference to FIG. 5. In some examples, a memory array may execute a set of instructions to control the functional elements of the memory array to perform the described functions. Additionally or alternatively, a memory array may perform aspects of the described functions using special-purpose hardware.

At 605, the memory array may identify a quantity of refresh intervals associated with refreshing memory cells of a memory device. The operations of 605 may be performed according to the methods described with reference to FIGS. 1 through 4. In some examples, aspects of the operations of 605 may be performed by a refresh interval identification component as described with reference to FIG. 5.

At 610, the memory array may identify a quantity of received refresh commands. The operations of 610 may be performed according to the methods described FIGS. 1 through 4. In some examples, aspects of the operations of 610 may be performed by a refresh command identification component as described with reference to FIG. 5.

At 615, the memory array may determine a quantity of refresh operations by determining a difference between the quantity of refresh intervals and the quantity of received refresh commands. The operations of 615 may be performed according to the methods described FIGS. 1 through 4. In some examples, aspects of the operations of 615 may be performed by a refresh operation determination component as described with reference to FIG. 5.

At 620, the memory array may adjust a supply voltage associated with the memory device based on the quantity of refresh operations. The operations of 620 may be performed according to the methods described with reference to FIGS. 1 through 4. In some examples, aspects of the operations of 620 may be performed by a voltage adjustment component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for identifying a quantity of refresh intervals associated with refreshing memory cells of a memory device, identifying a quantity of received refresh commands, determining a quantity of refresh operations by determining a difference between the quantity of refresh intervals and the quantity of received refresh commands, and adjusting a supply voltage associated with the memory device based on the quantity of refresh operations.

In some examples of the method 600 and the apparatus described herein, the refresh operations may be pending refresh operations.

In some examples of the method 600 and the apparatus described herein, adjusting the supply voltage may include operations, features, means, or instructions for increasing the supply voltage from a first voltage to a second voltage based on the quantity of refresh operations. In some examples of the method 600 and the apparatus described herein, a value of the second voltage may be based on the quantity of refresh operations.

Some examples of the method 600 and the apparatus described herein may further include operations, features, means, or instructions for receiving a first refresh command after adjusting the supply voltage, increasing the identified quantity of received refresh commands based on receiving the first refresh command, and adjusting the quantity of refresh operations based on increasing the identified quantity of received refresh commands. Some examples of the method 600 and the apparatus described herein may further include operations, features, means, or instructions for readjusting the supply voltage based on the adjusted quantity of received refresh commands.

Some examples of the method 600 and the apparatus described herein may further include operations, features, means, or instructions for transmitting, to a power management component, a signal indicating a target voltage based on the quantity of refresh operations, where adjusting the supply voltage includes adjusting, by the power management component, the supply voltage based on the target voltage.

In some examples of the method 600 and the apparatus described herein, identifying the quantity of refresh intervals may include operations, features, means, or instructions for increasing the target voltage from a first target voltage to a second target voltage based on identifying the first refresh interval.

In some examples of the method 600 and the apparatus described herein, identifying the quantity of refresh intervals may include operations, features, means, or instructions for increasing the target voltage from the second target voltage to a third target voltage least in part on identifying the second refresh interval.

Some examples of the method 600 and the apparatus described herein may further include operations, features, means, or instructions for receiving a refresh command after increasing the target voltage from the first target voltage to the second target voltage, and decreasing the target voltage from the second target voltage to a third target voltage based on receiving the refresh command.

Some examples of the method 600 and the apparatus described herein may further include operations, features, means, or instructions for determining that the quantity of refresh operations satisfies a threshold, where adjusting the supply voltage includes adjusting the supply voltage based on determining that the quantity of refresh operations satisfies the threshold.

Some examples of the method 600 and the apparatus described herein may further include operations, features, means, or instructions for determining, after adjusting the supply voltage, a second quantity of refresh operations by determining a second difference between the second quantity of refresh intervals and a second quantity of received refresh commands, determining that the second quantity of refresh operations satisfies a second threshold, and re-adjusting the supply voltage based on determining that the second quantity of refresh operations satisfies the second threshold.

Some examples of the method 600 and the apparatus described herein may further include operations, features, means, or instructions for identifying a window duration, where identifying the refresh intervals and the refresh commands includes identifying the refresh intervals and the refresh commands during the window duration.

Figure 7:
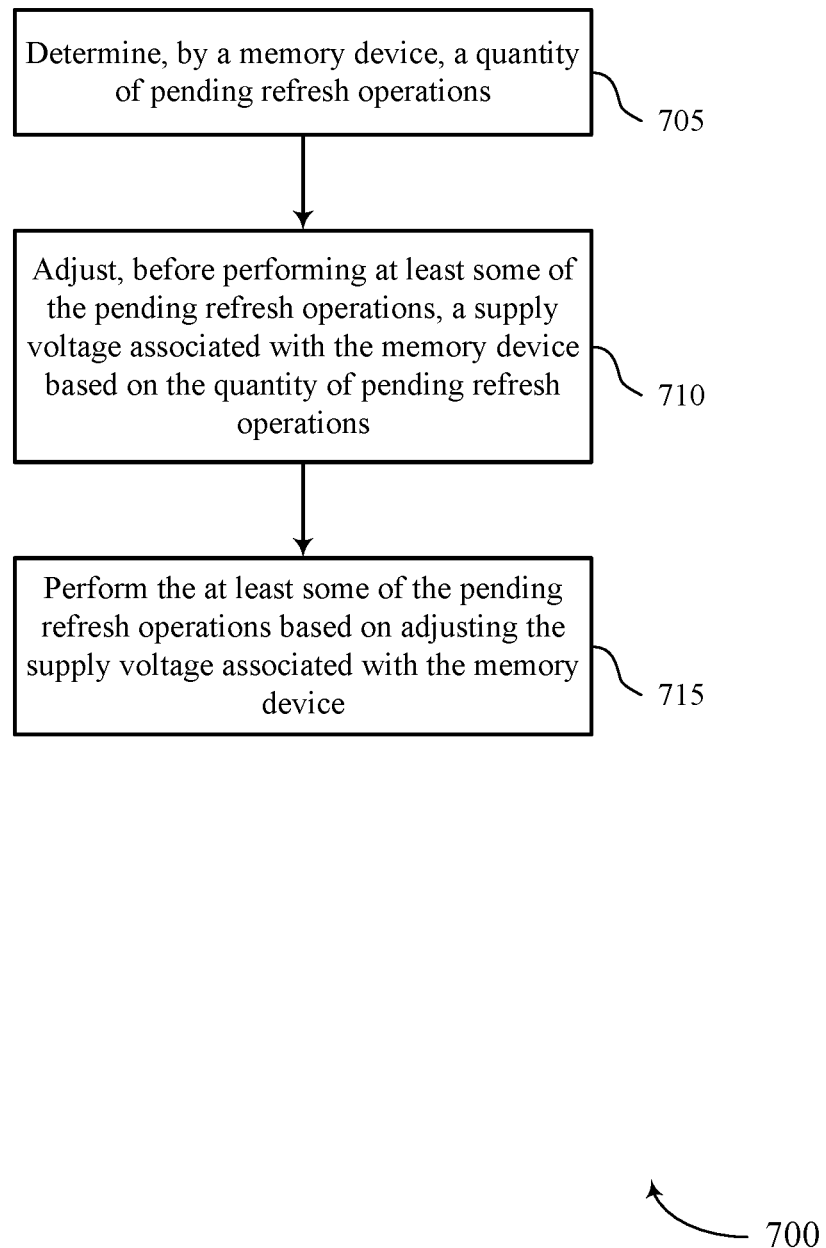

FIG. 7 shows a flowchart illustrating a method or methods 700 that supports voltage adjustment based on pending refresh operations in accordance with examples as disclosed herein. The operations of method 700 may be implemented by a memory array or its components as described herein. For example, the operations of method 700 may be performed by a memory array as described with reference to FIG. 5. In some examples, a memory array may execute a set of instructions to control the functional elements of the memory array to perform the described functions. Additionally or alternatively, a memory array may perform aspects of the described functions using special-purpose hardware.

At 705, the memory array may determine, by a memory device, a quantity of pending refresh operations. The operations of 705 may be performed according to the methods described with reference to FIGS. 1 through 4. In some examples, aspects of the operations of 705 may be performed by a refresh operation determination component as described with reference to FIG. 5.

At 710, the memory array may adjust, before performing at least some of the pending refresh operations, a supply voltage associated with the memory device based on the quantity of pending refresh operations. The operations of 710 may be performed according to the methods described with reference to FIGS. 1 through 4. In some examples, aspects of the operations of 710 may be performed by a voltage adjustment component as described with reference to FIG. 5.

At 715, the memory array may perform the at least some of the pending refresh operations based on adjusting the supply voltage associated with the memory device. The operations of 715 may be performed according to the methods described with reference to FIGS. 1 through 4. In some examples, aspects of the operations of 715 may be performed by a refresh performing component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for determining, by a memory device, a quantity of pending refresh operations, adjusting, before performing at least some of the pending refresh operations, a supply voltage associated with the memory device based on the quantity of pending refresh operations, and performing the at least some of the pending refresh operations based on adjusting the supply voltage associated with the memory device.

In some examples of the method 700 and the apparatus described herein, adjusting the supply voltage may include operations, features, means, or instructions for increasing the supply voltage from a first voltage to a second voltage based on the quantity of pending refresh operations.

Some examples of the method 700 and the apparatus described herein may further include operations, features, means, or instructions for transmitting, to a power management component, a signal indicating a target voltage of the supply voltage based on the quantity of pending refresh operations, where adjusting the supply voltage includes adjusting, by the power management component, the supply voltage based on the target voltage.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array, a power management component coupled with the memory array and for providing a supply voltage to the memory array, the apparatus configured to count a quantity of refresh intervals, count a quantity of received refresh commands, determine a quantity of refresh operations by determining a difference between the quantity of refresh intervals and the quantity of received refresh commands, and adjust, using the power management component, the supply voltage based on the quantity of refresh operations.

Some examples of the apparatus may include a counter for counting the quantity of refresh intervals.

In some examples, the apparatus may be configured to adjust the supply voltage by increasing the supply voltage from a first voltage to a second voltage based on the quantity of refresh operations.

In some examples, a value of the second voltage may be based on the quantity of refresh operations.

Some examples may further include transmitting, from the memory array to the power management component, a signal indicating a target voltage of the supply voltage based on the quantity of refresh operations, where the power management component may be configured to adjust the supply voltage based on the target voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
   identifying a quantity of refresh intervals associated with refreshing memory cells of a memory device;
   identifying a quantity of received refresh commands;
   determining a quantity of refresh operations by determining a difference between the quantity of refresh intervals and the quantity of received refresh commands; and
   adjusting a supply voltage associated with the memory device for a duration based at least in part on the quantity of refresh operations, wherein adjusting the supply voltage associated with the memory device for the duration comprises increasing the supply voltage from a first voltage to a second voltage based at least in part on the quantity of refresh operations.

2. The method of claim 1, wherein the refresh operations are pending refresh operations.

3. The method of claim 1, wherein a value of the second voltage is based at least in part on the quantity of refresh operations.

4. The method of claim 1, further comprising:
receiving a first refresh command after adjusting the supply voltage;
increasing the identified quantity of received refresh commands based at least in part on receiving the first refresh command; and
adjusting the quantity of refresh operations based at least in part on increasing the identified quantity of received refresh commands.

5. The method of claim 4, further comprising:
re-adjusting the supply voltage based at least in part on the adjusted quantity of received refresh commands.

6. The method of claim 1, further comprising:
transmitting, from a registered clock driver (RCD) to a power management component, a signal indicating a target voltage based at least in part on the quantity of refresh operations, wherein adjusting the supply voltage comprises adjusting, by the power management component, the supply voltage based at least in part on the target voltage.

7. The method of claim 1, further comprising:
transmitting, from the memory device to a power management component, a signal indicating a target voltage based at least in part on the quantity of refresh operations, wherein adjusting the supply voltage comprises adjusting, by the power management component, the supply voltage based at least in part on the target voltage.

8. The method of claim 7, wherein identifying the quantity of refresh intervals comprises identifying a first refresh interval of the quantity of refresh intervals, the method further comprising:
increasing the target voltage from a first target voltage to a second target voltage based at least in part on identifying the first refresh interval.

9. The method of claim 8, wherein identifying the quantity of refresh intervals comprises identifying a second refresh interval of the quantity of refresh intervals after identifying the first refresh interval, the method further comprising:
increasing the target voltage from the second target voltage to a third target voltage least in part on identifying the second refresh interval.

10. The method of claim 8, further comprising:
receiving a refresh command after increasing the target voltage from the first target voltage to the second target voltage; and
decreasing the target voltage from the second target voltage to a third target voltage based at least in part on receiving the refresh command.

11. A method comprising:
identifying a quantity of refresh intervals associated with refreshing memory cells of a memory device;
identifying a quantity of received refresh commands;
determining a quantity of refresh operations by determining a difference between the quantity of refresh intervals and the quantity of received refresh commands;
determining that the quantity of refresh operations satisfies a threshold; and
adjusting a supply voltage associated with the memory device for a duration based at least in part on the quantity of refresh operations, wherein adjusting the supply voltage comprises adjusting the supply voltage based at least in part on determining that the quantity of refresh operations satisfies the threshold.

12. The method of claim 11, further comprising:
determining, after adjusting the supply voltage, a second quantity of refresh operations by determining a second difference between a second quantity of refresh intervals and a second quantity of received refresh commands;
determining that the second quantity of refresh operations satisfies a second threshold; and
re-adjusting the supply voltage based at least in part on determining that the second quantity of refresh operations satisfies the second threshold.

13. The method of claim 1, further comprising:
identifying a window duration, wherein identifying the refresh intervals and the refresh commands comprises identifying the refresh intervals and the refresh commands during the window duration.

14. The method of claim 1, wherein identifying the refresh intervals comprises incrementing a refresh interval counter for each elapsed refresh interval, and wherein identifying the refresh commands comprises decrementing the refresh interval counter for each received refresh command.

15. An apparatus comprising:
a memory array; and
a power management component coupled with the memory array and for providing a supply voltage to the memory array, the apparatus configured to:
count a quantity of refresh intervals associated with refreshing memory cells of a memory device; and
adjust the supply voltage by increasing the supply voltage from a first voltage to a second voltage based at least in part on the quantity of refresh intervals.

16. The apparatus of claim 15, further comprising:
a counter for counting the quantity of refresh intervals.

17. The apparatus of claim 7, wherein a value of the second voltage is based at least in part on the quantity of refresh intervals.

18. An apparatus comprising:
a memory array; and
a power management component coupled with the memory array and for providing a supply voltage to the memory array, the apparatus configured to:
count a quantity of refresh intervals associated with refreshing memory cells of a memory device; and
transmit, from the memory array to the power management component, a signal indicating a target voltage of the supply voltage based at least in part on the quantity of refresh intervals, wherein the power management component is configured to adjust the supply voltage based at least in part on the target voltage.

19. A method comprising:
determining, by a memory device, a quantity of pending refresh operations;
adjusting, before performing at least some of the pending refresh operations and based at least in part on the quantity of pending refresh operations, a supply voltage associated with the memory device, wherein adjusting the supply voltage comprises increasing the supply voltage from a first voltage to a second voltage based at least in part on the quantity of pending refresh operations; and
performing the at least some of the pending refresh operations based at least in part on adjusting the supply voltage associated with the memory device.

20. The method of claim 19, further comprising:
transmitting, from a registered clock driver (RCD) to a power management component, a signal indicating a target voltage of the supply voltage based at least in part on the quantity of pending refresh operations, wherein adjusting the supply voltage comprises adjusting, by the power management component, the supply voltage based at least in part on the target voltage.

21. The method of claim 19, further comprising:
transmitting, from the memory device to a power management component, a signal indicating a target voltage of the supply voltage based at least in part on the quantity of pending refresh operations, wherein adjusting the supply voltage comprises adjusting, by the power management component, the supply voltage based at least in part on the target voltage.

* * * * *